US010297981B2

(12) United States Patent
Bovington et al.

(10) Patent No.: US 10,297,981 B2
(45) Date of Patent: May 21, 2019

(54) DENSE-COMB REDUNDANT RING LASER ARRAY

(71) Applicant: Oracle International Corporation, Redwood Shores, CA (US)

(72) Inventors: Jock T. Bovington, La Jolla, CA (US); Xuezhe Zheng, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 407 days.

(21) Appl. No.: 15/292,792

(22) Filed: Oct. 13, 2016

(65) Prior Publication Data

US 2018/0261983 A1    Sep. 13, 2018

(51) Int. Cl.
| | |
|---|---|
| *G02B 6/42* | (2006.01) |
| *G02B 6/43* | (2006.01) |
| *H01S 5/00* | (2006.01) |
| *H01S 5/10* | (2006.01) |
| *H01S 5/30* | (2006.01) |
| *H01S 5/40* | (2006.01) |
| *H01S 5/50* | (2006.01) |

(Continued)

(52) U.S. Cl.
CPC .......... *H01S 5/5027* (2013.01); *G02B 6/4204* (2013.01); *G02B 6/43* (2013.01); *H01S 5/0085* (2013.01); *H01S 5/1028* (2013.01); *H01S 5/142* (2013.01); *H01S 5/3013* (2013.01); *H01S 5/4068* (2013.01); *H01S 3/106* (2013.01); *H01S 5/0683* (2013.01); *H01S 5/4062* (2013.01); *H01S 5/4087* (2013.01)

(58) Field of Classification Search
CPC ... H01S 5/5027; G02B 6/4204; G02B 6/4207; G02B 6/43
See application file for complete search history.

(56) References Cited

U.S. PATENT DOCUMENTS

| | | | |
|---|---|---|---|
| 2018/0115139 A1* | 4/2018 | Bovington | H01S 5/142 |
| 2018/0159293 A1* | 6/2018 | Bovington | G02F 1/0147 |
| 2018/0159294 A1* | 6/2018 | Bovington | H01S 3/083 |

OTHER PUBLICATIONS

Tanaka et al. "Four-Wavelength Silicon Hybrid Laser Array with RingResonator Based Mirror for Efficient CWDM Transmitter", 2013 Optical Fiber Communication Conference and Exposition and the National Fiber Optic Engineers Conference (OFC/NFOEC) (Mar. 2013).*

(Continued)

*Primary Examiner* — Eric L Bolda
(74) *Attorney, Agent, or Firm* — Park, Vaughan, Fleming & Dowler LLP (57) ABSTRACT

The disclosed embodiments relate to the design of a hybrid laser comprising a shared ring mirror coupled to a pair of buses by a 3 dB coupler (also referred to as a "symmetric splitter"), which is described in more detail below. Each bus is also coupled to an array of ring filters, wherein each ring filter couples an associated reflective silicon optical amplifier (RSOA) to the shared ring mirror and in doing so forms a Verniered ring pair with the shared ring mirror. The resulting system provides a comb source with redundant channels that can provide individual outputs or a shared output. This hybrid laser provides a significant improvement over existing comb-based lasers by providing redundancy for at least one laser channel.

20 Claims, 6 Drawing Sheets

(51) Int. Cl.
*H01S 5/0683* (2006.01)
*H01S 5/14* (2006.01)
*H01S 3/106* (2006.01)

(56) References Cited

OTHER PUBLICATIONS

Nemoto et al.; "Narrow spectral linewidth wavelength tunable laser with Si photonicwire waveguide ring resonators," Group IV photonics, ThD4, 126-128 (2012).
Fujioka et al.; "Compact and low power consumption hybrid integrated wavelength tunable laser module using silicon waveguide resonators," J. of Lightwave Technology 28 (21), 3115-3120 (2010).
Akiyama et al.; "1-Vpp 10-Gb/s operation of slow-light silicon Mach-Zehnder modulator in wavelength range of 1 nm," Group IV photonics, WC7, 45-47 (2010).
Akiyama et al.; "Wavelength-tuning-free 10-Gb/s operation of a silicon-integrated resonantly-enhanced modulator and single-mode laser," Group IV photonics, FD3, 358-360 (2012).
Hulme et al.; "Widely tunable Vernier ring laser on hybrid silicon.," Opt. Express, vol. 21, No. 17, pp. 19718-19722, Aug. 2013.
Lee et al.; "High power and widely tunable Si hybrid external-cavity laser for power efficient Si photonics WDM links.," Opt. Express, vol. 22, No. 7, pp. 7678-7685, Apr. 2014.
Heck et al.; "Hybrid Silicon Photonic Integrated Circuit Technology," IEEE J. Sel. Top. Quantum Electron., vol. 19, No. 4, pp. 6100117-6100117, Jul. 2013.

\* cited by examiner

DENSE-COMB REDUNDANT RING LASER ARRAY

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The disclosed embodiments generally relate to the design of a semiconductor-based laser. More specifically, the disclosed embodiments relate to the design of a dense-comb redundant ring laser array that provides redundancy for a number of different laser components.

Related Art

Silicon photonics is a promising new technology that can provide large communication bandwidth, low latency and low power consumption for inter-chip and intra-chip connections or optical links. In order to achieve low-latency, high-bandwidth optical connectivity, a number of optical components are required, including: optical modulators, optical detectors, wavelength multiplexers/demultiplexers and optical sources such as lasers.

Some recently developed optical networking systems provide large numbers (e.g., hundreds or thousands) of parallel links, which makes the reliability of every component in each of the links vital to reliability of the systems as a whole. Perhaps the single least-reliable components in these systems are the group III-V compound semiconductor devices that are used in fabricating lasers. These devices can be tested thoroughly during the manufacturing process, but long-term reliability is not guaranteed. Note that the hybrid ring laser concept provides a scalable solution to implementing highly parallel transceivers by simplifying the gain medium through use of uniform reflective silicon optical amplifier (RSOA) components, and replacing potential failure mechanisms of wavelength-selective mirrors known as distributed Bragg reflectors (DBRs) with silicon ring filter mirrors. However, providing additional redundancy for the RSOA components could improve the reliability of such systems considerably.

Hence, what is needed is a technique for implementing a hybrid ring laser that facilitates providing redundancy for components in such lasers.

SUMMARY

One embodiment of the present disclosure provides an integrated laser that includes a set of reflective silicon optical amplifiers (RSOAs), including a first subset of RSOAs and a second subset of RSOAs. It also includes a set of ring-resonator filters, including a first subset of ring-resonator filters associated with the first subset of RSOAs, and a second subset of ring-resonator filters associated with the second subset of RSOAs. It additionally includes a set of intermediate waveguides, wherein each intermediate waveguide is attached to an RSOA in the set of RSOAs, and channels light in proximity to an associated ring-resonator filter in the set of ring-resonator filters to cause optically coupled light to circulate in the associated ring-resonator filter.

The integrated laser also includes a shared ring resonator, and a symmetric power splitter comprising a reciprocal network having a first port, a second port, a third port and a fourth port, wherein light entering the first port is approximately equally split with a 90-degree phase difference between the third port and the fourth port, and wherein light entering the second port is approximately equally split with a 90-degree phase difference between the third port and the fourth port.

The integrated laser also includes a first shared optical waveguide, which is coupled to the first port and passes in proximity to the first subset of ring-resonator filters so that the first subset of ring-resonator filters cause optically coupled light to flow in the first shared optical waveguide. It also includes a second shared optical waveguide, which is coupled to the second port and passes in proximity to the second subset of ring-resonator filters so that the second subset of ring-resonator filters cause optically coupled light to flow in the second shared optical waveguide. The integrated laser additionally includes a third optical waveguide coupled to the third port, which channels light emanating from the third port in proximity to the shared ring resonator to cause optically coupled light to circulate in a first direction in the shared ring resonator, and a fourth optical waveguide coupled to the fourth port, which channels light emanating from the fourth port in proximity to the shared ring resonator to cause optically coupled light to circulate in a second direction, which is opposite to the first direction, in the shared optical ring resonator.

Finally, the integrated laser includes an output optical waveguide, which is optically coupled to the shared ring resonator.

In some embodiments, each ring-resonator filter in the set of ring-resonator filters has a tunable frequency response.

In some embodiments, the ring-resonator filters in the set of ring-resonator filters are tuned to lock onto different resonance frequencies of the shared ring resonator.

In some embodiments, the set of ring-resonator filters are tuned to lock onto a set of resonance frequencies for the shared ring resonator, wherein successive resonance frequencies in the set of resonance frequencies alternate between ring-resonator filters coupled to the first shared optical waveguide and ring-resonator filters coupled to the second shared optical waveguide, thereby reducing encroachment between the successive resonance frequencies on each of the first and second shared optical waveguides. This facilitates increasing the density of resonance frequencies that can be simultaneously utilized by the integrated laser.

In some embodiments, the integrated laser further comprises a failure-detection mechanism that detects a failure of an RSOA in the set of RSOAs, and a switching mechanism that activates a spare RSOA when the failure-detection mechanism detects that the RSOA has failed, wherein the spare RSOA provides the same frequency as the failed RSOA.

In some embodiments, light emanating from a first RSOA in the first subset of RSOAs is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed back through the first shared optical waveguide back to the first RSOA, and wherein no reflected light is directed back through the second shared optical waveguide due to phase cancellation. Note that the first RSOA, the first shared optical waveguide, the third and fourth optical waveguides, the symmetric power splitter and the optical ring resonator collectively form a first lasing cavity for the integrated laser.

Similarly, light emanating from a second RSOA in the second subset of RSOAs is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed through the second shared optical waveguide back to the second RSOA, and wherein no reflected light is directed back through the first shared optical waveguide due to phase cancellation. Note that the second RSOA, the second shared optical waveguide, the third and fourth optical waveguides, the symmetric power splitter and the optical ring resonator collectively form a second lasing cavity for the integrated laser.

In some embodiments, the output optical waveguide has two ends that function as two outputs of the integrated laser.

In some embodiments, a modulator is coupled to each output of the integrated laser, wherein each output provides an optical carrier signal that is modulated by the associated modulator to communicate information.

In some embodiments, the set of RSOAs are located on one or more RSOA semiconductor chips, wherein the one or more RSOA semiconductor chips are separate from a semiconductor chip that includes the set of intermediate waveguides, the set of ring-resonator filters, the symmetric power splitter, the first and second shared optical waveguides, the third and fourth optical waveguides, the optical ring resonator and the output waveguide.

In some embodiments, the symmetric power splitter comprises a directional coupler or a multi-mode interferometer.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

The disclosed embodiments relate to the design of a hybrid laser comprising a shared ring mirror coupled to a pair of shared buses by a 3 dB coupler (also referred to as a "symmetric splitter"), which is described in more detail below. Each shared bus is coupled to an array of ring filters, wherein each ring filter couples an associated RSOA to the shared ring mirror, and in doing so forms a Verniered ring pair with the shared ring mirror. The resulting system provides a comb source with redundant channels that can provide either individual outputs or a shared output. These outputs can be tapped from a number of locations including the shared ring itself.

This hybrid laser provides a significant improvement over existing comb-based lasers by facilitating redundancy for at least one laser channel. This redundancy is quite useful because the III-V material RSOAs used to make such lasers are the least reliable components in such transceivers. This design allows a series of RSOAs to replace one or more failed RSOAs, while using the same ring mirror as a wavelength-selective filter, thereby reducing link down time, and eliminating the need for additional switching or multiplexing elements which can result in loss or require additional power.

As mentioned above, a wavelength division multiplexed (WDM) array can be formed by sharing one of the two rings in a Verniered ring pair. This locks the lasers to a grid defined by the free spectral range of the shared ring. This also facilitates using spare gain elements, such as spare RSOAs, which can take the place of failing primary RSOAs, or can flexibly add bandwidth to the transmitter as required.

An important distinction from existing hybrid lasers is that the multiple lasers provided by the disclosed embodiments share a single ring; this ties the resulting laser wavelengths to a grid defined by the shared ring's free spectral range (FSR). The size of the other "non-shared" rings in the hybrid laser can be selected to minimize the tuning required for each of them to lock to a unique resonance of the shared ring.

A comb laser called a "Verniered-Ring Comb Laser" (VRCL) has been previously designed. See U.S. patent Ser. No. 15/047,090, entitled "Ring Resonator-Based Laser with Multiple Wavelengths," by inventors Jock T. Bovington and Xuezhe Zheng, filed 18 Feb. 2016, which is hereby incorporated by reference. The disclosed embodiments improve on this VRCL design by: (1) making it possible to double the density of the comb lines in the VRCL; (2) decreasing cavity length; (3) providing additional redundancy in the case of a ring failure; and (4) providing the ability to lock two combs to the shared ring mirror, which facilitates twofold multiplexing, such as polarization-division multiplexing.

In addition, the disclosed embodiments provide all of the advantages of the VRCL design, such as providing the ability to replace the least-reliable laser component, the III-V gain medium, with a spare resulting in a significantly more reliable laser without the need for additional switching to facilitate power splitting, or additional service requirements for a module swap.

Figure 1A:
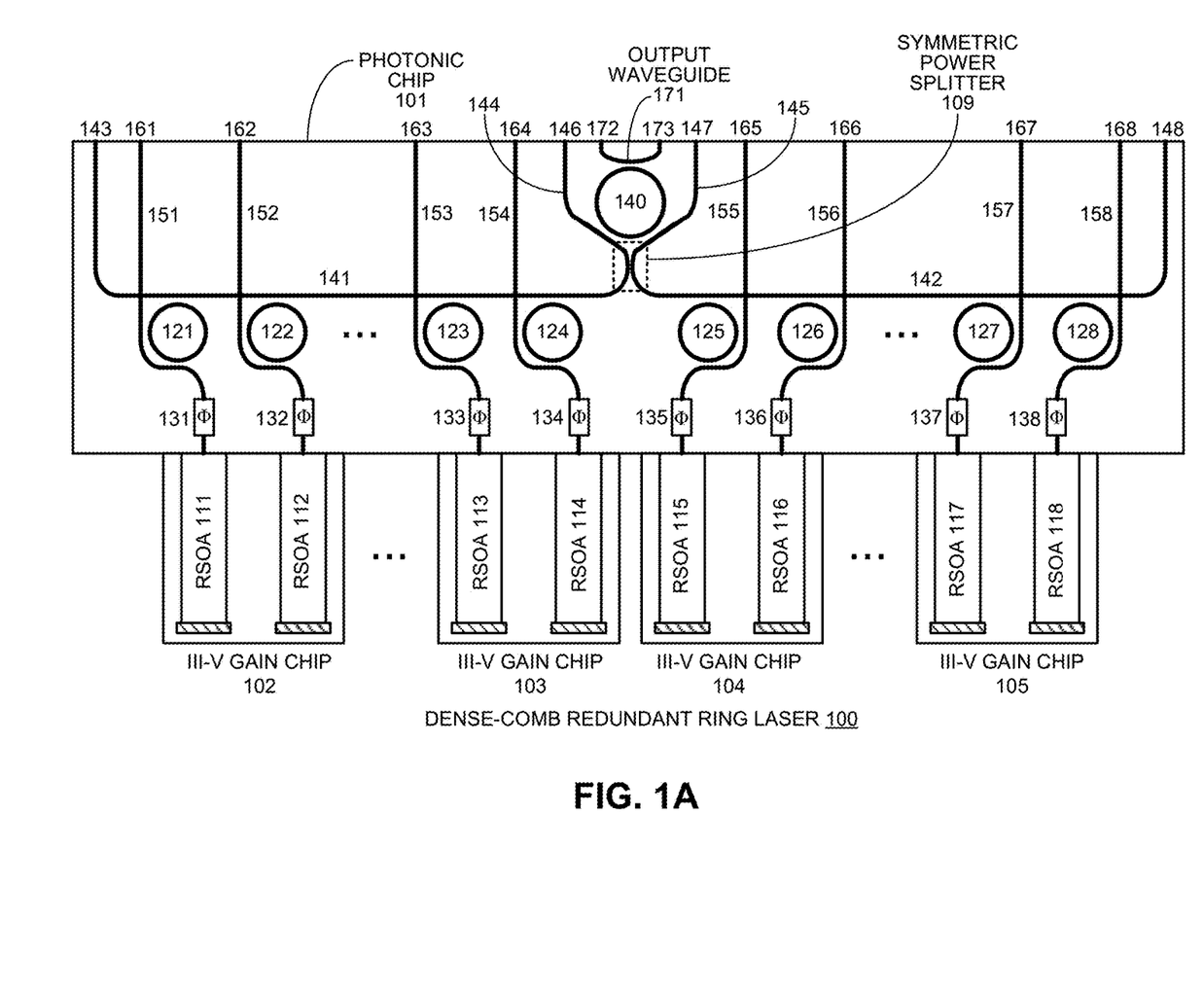
FIG. 1A illustrates the design of a dense-comb redundant ring laser in accordance with the disclosed embodiments.

More specifically, FIG. 1A illustrates the design of a dense-comb redundant ring laser 100 in accordance with the disclosed embodiments. Dense-comb redundant ring laser 100 includes a number of optical III-V gain chips, including III-V gain chips 102-105, wherein III-V gain chip 102 includes RSOAs 111-112, III-V gain chip 103 includes RSOAs 113-114, III-V gain chip 104 includes RSOAs 115-116, and III-V gain chip 105 includes RSOAs 117-118.

When RSOAs 111-118 are powered on, they generate optical signals, which can have different carrier wavelengths $\lambda_2$, $\lambda_3$, $\lambda_5$, $\lambda_7$ and $\lambda_8$, respectively. These optical signals feed into intermediate waveguides 151-158, which are located in a separate photonic chip 101. Intermediate waveguides 151-158 feed through phase modulators 131-138 and then pass in proximity to associated ring-resonator filters 121-128 in a manner that causes optically coupled light to circulate in ring-resonator filters 121-128. Intermediate waveguides 151-158 also feed across photonic chip 101 to produce single wavelength outputs 161-168. Alternatively, instead of feeding through to outputs 161-168, waveguides 151-158 can feed into photodetectors that are integrated into photonic chip 101. In this way, intermediate waveguides 151-158 do not have to cross shared optical waveguides 141 and 142.

Shared optical waveguide 141 is routed in proximity to ring-resonator filters 121-124 so that circulating light in ring-resonator filters 121-124 causes optically coupled light to flow in shared optical waveguide 141. Shared optical waveguide 141 also feeds into an input of symmetric power splitter 109, and additionally feeds through photonic chip 101 to produce a multiple-wavelength output 143. Similarly, shared optical waveguide 142 is routed in proximity to ring-resonator filters 125-128 so that circulating light in ring-resonator filters 125-128 causes optically coupled light to flow in shared optical waveguide 142. Shared optical waveguide 142 also feeds into another input of symmetric power splitter 109, and additionally feeds through photonic chip 101 to produce a multiple-wavelength output 148.

Symmetric power splitter 109 comprises a reciprocal network having a first port coupled to shared optical waveguide 141, a second port coupled to shared optical waveguide 142, a third port coupled to optical waveguide 144 and a fourth port coupled to optical waveguide 145. Light entering the first port is approximately equally split with a 90-degree phase difference between the third port and the fourth port, and light entering the second port is approximately equally split with a 90-degree phase difference between the third port and the fourth port.

Optical waveguide 144 routes light emanating from the third port of symmetric power splitter 109 in proximity to a shared ring resonator 140 to cause optically coupled light to circulate in a first direction in shared ring resonator 140. Similarly, optical waveguide 145 routes light emanating from the fourth port of symmetric power splitter 109 in proximity to shared ring resonator 140 to cause optically coupled light to circulate in a second direction, which is opposite to the first direction, in shared ring resonator 140. In general, the shared ring resonator 140 can be replaced with any symmetric mirror that returns equal power and phase back to optical waveguides 144 and 145. In alternative embodiments, this symmetric mirror can be implemented using: (1) two optical ring resonators, which are optically coupled together in a Vernier configuration; (2) two identical mirrors; or (3) a simple loop.

The light circulating in shared ring resonator 140 causes optically coupled light to reflect back through optical waveguides 144 and 145 to symmetric power splitter 109. In some embodiments, shared ring resonator 140 is implemented as a thermally tunable ring. In other embodiments, instead of using a tunable ring, shared ring resonator 140 is implemented using an athermal waveguide.

The phase relationships maintained within symmetric power splitter 109 ensure that the reflected light which exits shared ring resonator 140 is only directed back through a shared optical waveguide to the RSOA that originated the light. At the same time, phase cancellation within symmetric power splitter 109 ensures that no reflected light is directed back through the other shared optical waveguide, which is not coupled to the RSOA that originated the light.

Optical waveguide 144 also feeds through photonic chip 101 to produce a multiple-wavelength output 146. Optical waveguide 144 can also be coupled to a monitor (not shown), which can be used to determine the alignment between the laser cavity modes with a mirror resonance for shared ring resonator 140. Similarly, optical waveguide 145 also feeds through photonic chip 101 to produce a multiple-wavelength output 147. Optical waveguide 145 can also be coupled to a shared ring resonator (not shown), which can be similarly used to determine the alignment between the laser cavity modes with a mirror resonance for shared ring resonator 140.

The system illustrated in FIG. 1A also includes an output waveguide which is optically coupled to the optical ring resonator, and which has two ends 172 and 173 that function as outputs of the integrated laser. In some embodiments, a modulator (not shown) is coupled to each output of the integrated laser, wherein each output provides an optical carrier signal that is modulated by the associated modulator to communicate information.

During operation of the system illustrated in FIG. 1A, light emanating from RSOA 111 feeds through intermediate waveguide 151 and causes light to circulate in ring-resonator filter 121. The light circulating in ring-resonator filter 121 causes light to flow in shared optical waveguide 141, which feeds into an input of symmetric power splitter 109. Symmetric power splitter 109 splits the input light between the optical waveguides 144 and 145. This causes optically coupled light to circulate in opposite directions in shared ring resonator 140. This causes optically coupled light to reflect back through optical waveguides 144 and 145 into symmetric power splitter 109. Symmetric power splitter 109 combines the reflected light and directs it back through the intermediate waveguide 151 to RSOA 111. At the same time, no light that originated from RSOA 111 is directed from symmetric power splitter 109 back through shared optical waveguide 145 due to phase cancellation. In this way, RSOA 111, shared optical waveguide 121, optical waveguides 144 and 145, symmetric power splitter 109 and shared ring resonator 140 collectively form a lasing cavity for the integrated laser, wherein the frequency of this lasing cavity is determined by the overlap between the spectra of ring-resonator filter 151 and shared ring resonator 140. Light emanating from the other RSOAs 112-118 is similarly directed through their respective intermediate waveguides, ring-resonator filters and shared optical waveguides to form their own lasing cavities.

Figure 1B:
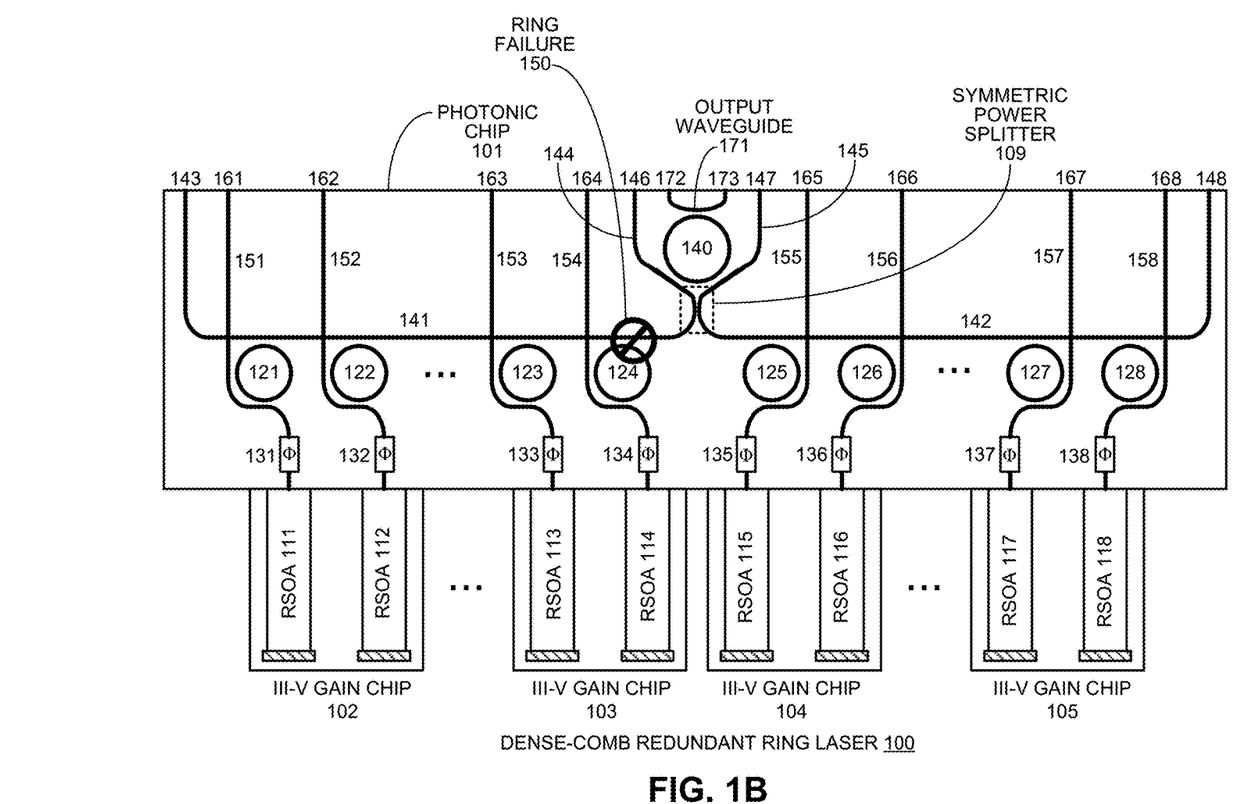
FIG. 1B illustrates an exemplary ring failure in accordance with the disclosed embodiments.
Figure 2:
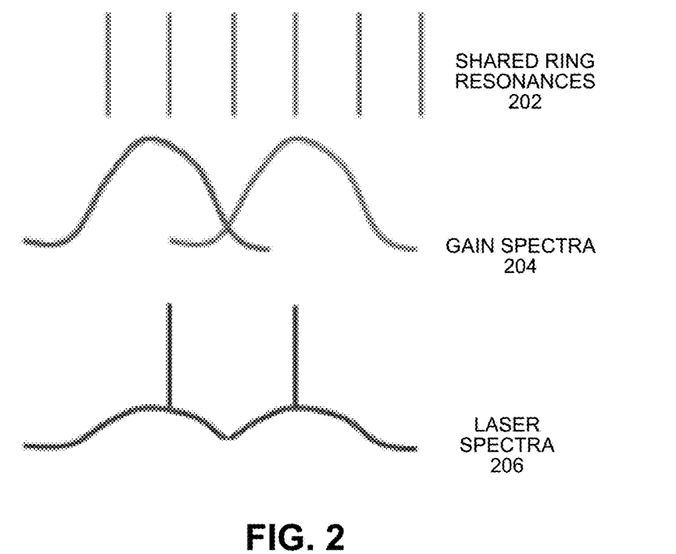
FIG. 2 illustrates exemplary gain spectra and laser spectra for the laser in accordance with the disclosed embodiments.

If the characteristics of RSOAs 111-118 are selected appropriately, and the ring-resonator filters 121-128 are tuned appropriately, the system illustrated in FIG. 1B can provide a multi-band laser. For example, FIG. 2 illustrates gain spectra 204 and laser spectra 206 for a multi-band implementation of an integrated laser in accordance with the disclosed embodiments. As illustrated in FIG. 2, the combination of the wavelength-selective nature of the gain media and the shared ring resonances 202 combine to provide laser spectra 206 that provide multiple WDM outputs.

Advantages

Figure 3:
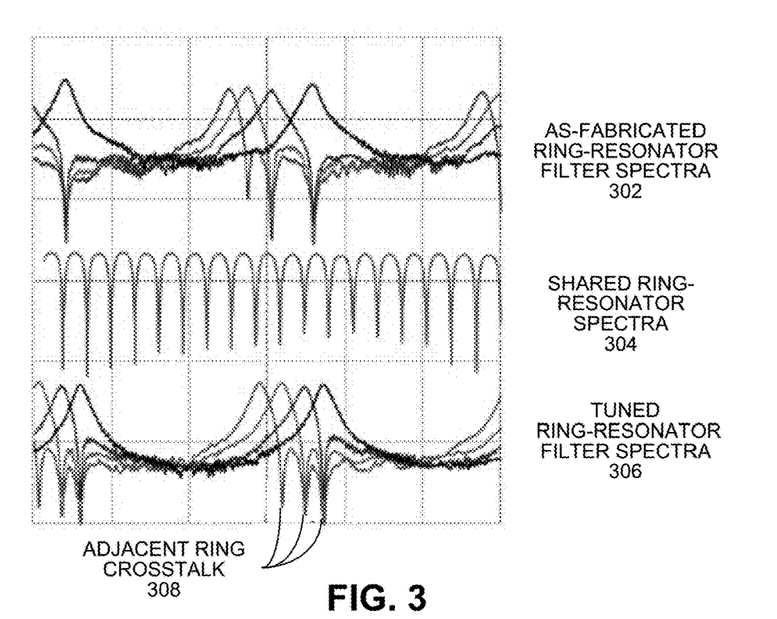
FIG. 3 illustrates ring-resonator filter spectra alongside shared ring resonator spectra in accordance with the disclosed embodiments.

As mentioned above, the disclosed embodiments provide significant advantages over existing VRCL designs. In particular, the disclosed embodiments improve on the VRCL design by doubling the density of the comb lines in a VRCL, which are currently limited by the bandwidth-loss trade-off of the ring-resonator filters. This trade-off is illustrated in FIG. 3, which presents spectral data collected from an exemplary 200 GHz VRCL. Note that FIG. 3 illustrates graphs of three different types of spectra. The top graph illustrates as-fabricated ring-resonator filter spectra 302 from a shared optical waveguide that carries signals from four different ring-resonator filters. The middle graph illustrates shared ring-resonator spectra 304 from a shared ring-resonator that the shared optical waveguide is optically coupled to. Finally, the lower graph illustrates tuned ring-resonator filter spectra 306 from the shared optical waveguide after the four ring-resonator filters have been tuned. Note that the spectral peaks for the as-fabricated ring-resonator filters illustrated in graph 302 are not aligned with the shared ring resonances illustrated in graph 304. In contrast, the spectral peaks for the tuned ring-resonator spectra 306 are aligned with the shared ring resonances. However, note that when the spectra for the four tuned ring-resonator filters combine, adjacent ring crosstalk 308 arises. For the exemplary 200 GHz VRCL, this crosstalk is not significant. However, if the spacing were reduced to 50 GHz or less, the crosstalk could begin to dominate. Also, the spectral peaks for the as-fabricated array may not appear in frequency order at 50 GHz because the fabrication variation would be much greater than the channel spacing.

Also, as mentioned above, the disclosed embodiments improve on the VRCL design by reducing channel length. A typical RSOA spacing in a VRCL design is 250 microns. Hence, in the case where an array of 8 or 16 channels is used, the total cavity length of the longest channel can be 4 mm or more. By using two shared buses instead of a single bus to accommodate the same number of RSOAs, the cavity length can be decreased by half while providing additional redundancy.

The disclosed embodiments also provide additional redundancy in case of a ring failure. Note that such a ring failure would prevent lasing from channels that include the through transmission of a failed ring in their path for all wavelengths impacted by the ring resonator failure. Also note that such failures can include a ring heater failure or a catastrophic optical incident related to the ring. FIG. 1B illustrates an exemplary ring failure 150 where the first channel of the left comb array associated with shared waveguide 141 fails. This will affect all of the other channels associated with shared waveguide 141, because they all include a transmission past the first channel. To deal with this type of failure, the right comb in its entirety can be used to fill the affected channels.

The disclosed embodiments also provide additional redundancy by using multiple gain chips. The system illustrated in FIG. 1A includes multiple gain chips, including III-V gain chips 102-105, wherein each of these gain chips can be individually replaced if they fail. This feature is important because yield decreases with increasing array size. Hence, it may only be possible to source small count arrays for these chips (e.g., 4-arrays or 6-arrays) to meet reasonable yield thresholds. In this case, multiple chips could be bonded on each bus to reach the channel count required for a particular application.

The disclosed embodiments also provide the ability to lock two combs to the shared ring mirror, which facilitates twofold multiplexing, such as polarization division multiplexing. If there exist two WDM combs, which have identical wavelengths, they can be modulated individually and then multiplexed to share the same fiber. The most direct example of such multiplexing is polarization-division multiplexing, which fills the two polarization states.

FIG. 1A illustrates an example of a dense-comb redundant ring laser which can be configured to have a balanced dual output, wherein each output includes spectra from both combs. This balanced dual output is provided by output waveguide 171, which produces two outputs 172 and 173. Note that outputs 172 and 173 can be coherently combined, and a phase tuner can be used if a single output waveguide is desired. For example, a phase tuner and a y-combiner can be used to select which combination of the two combs would be output on the single waveguide, but this configuration cannot combine both of the comb powers equally without incurring a 3 dB loss due to the reciprocity principle.

Alternatively, each comb spectrum could be collected individually from the output waveguide of each bus. The reason that these spectra can be collected individually from these waveguides is that the symmetric splitter (3 dB coupler) 109 provides a phase relationship such that power coming from one port of the symmetric splitter will be reflected fully back on that same port by the shared ring resonator 140. The same is true for the other input to symmetric splitter 109. Any variation of the splitting ratio from 3 dB will result in crosstalk to the opposite side.

Operation of the Integrated Laser

Figure 4A:
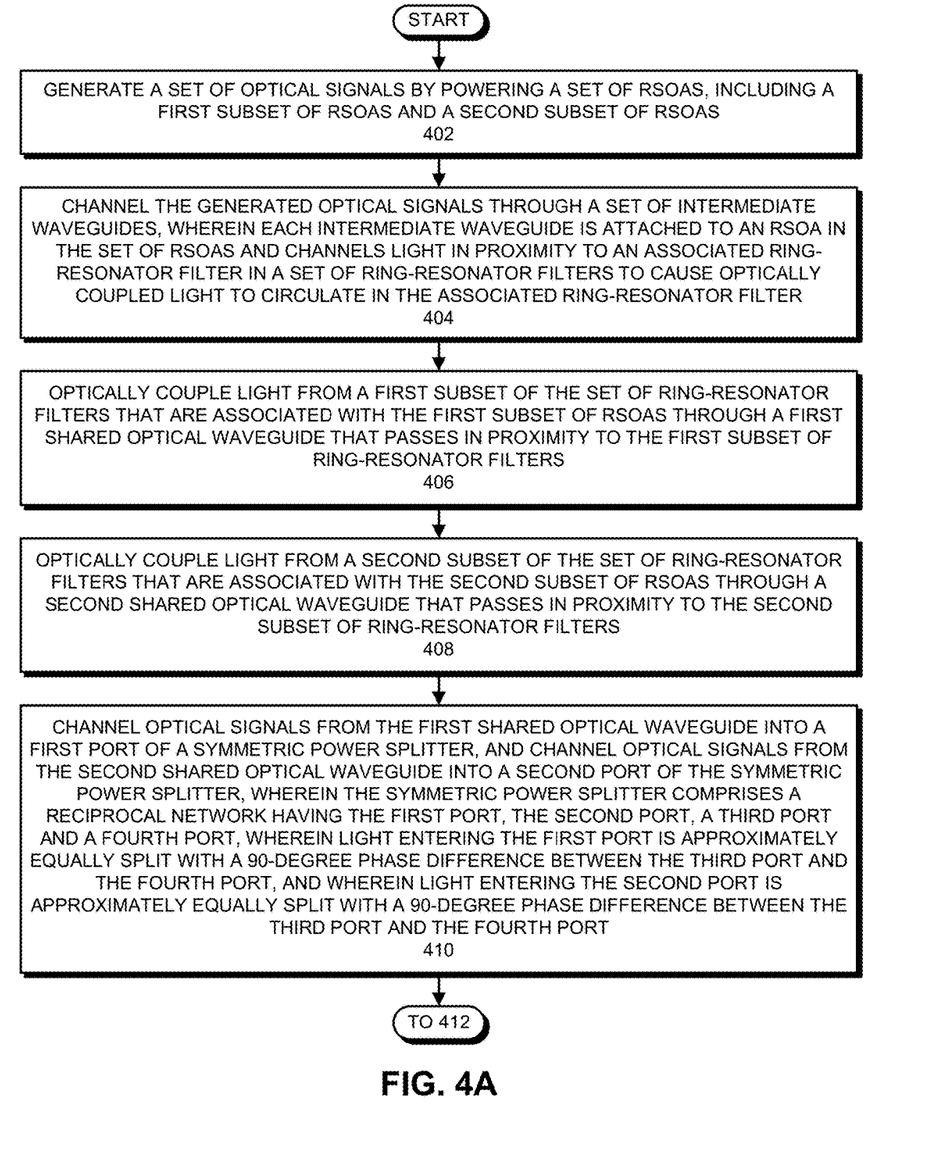
FIGS. 4A-4B present a flow chart illustrating how a dense-comb redundant ring laser operates in accordance with the disclosed embodiments.
Figure 4B:
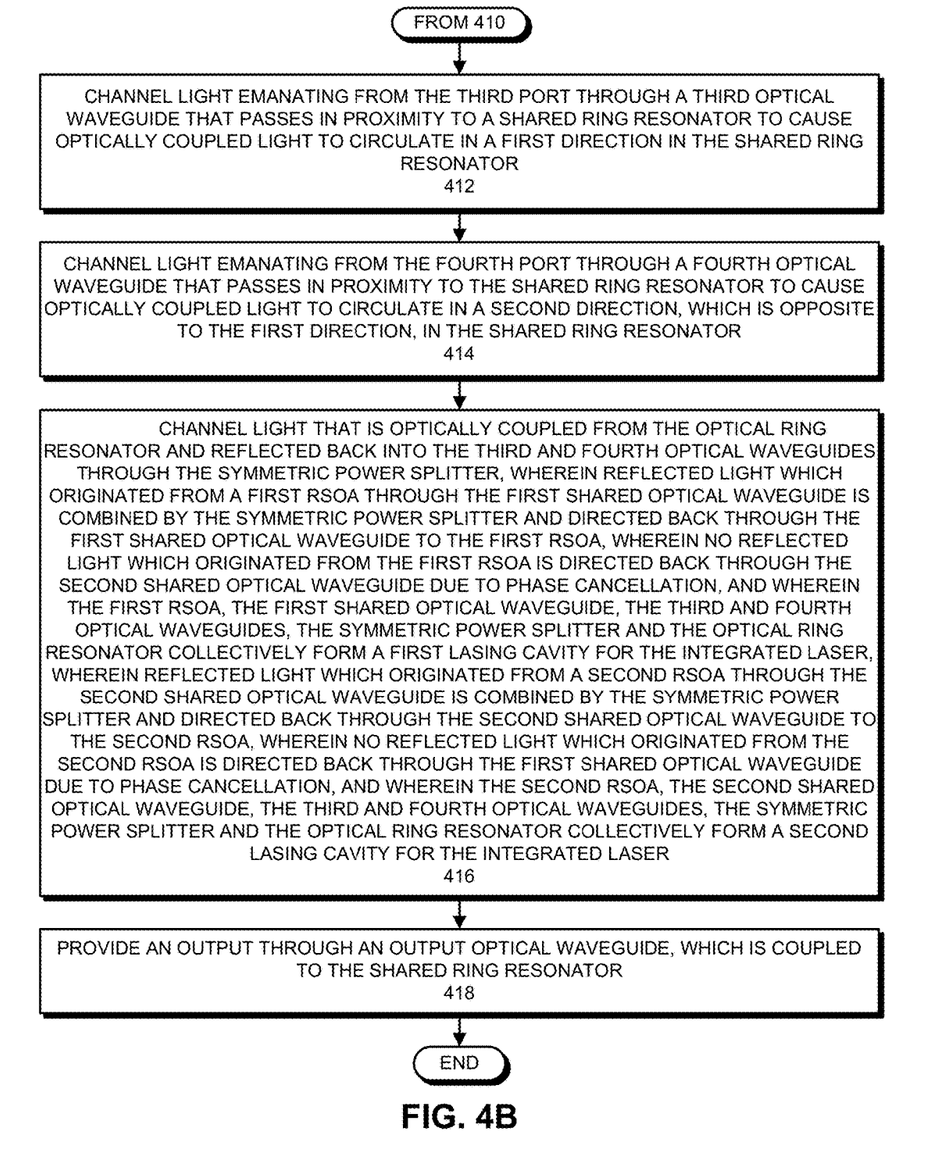

FIGS. 4A-4B present a flow chart illustrating how a system comprising a dense-comb redundant ring laser operates in accordance with the disclosed embodiments. First, the system generates a set of optical signals by powering a set of RSOAs, including a first subset of RSOAs and a second subset of RSOAs (step 402). Next, the system channels the generated optical signals through a set of intermediate waveguides, wherein each intermediate waveguide is attached to an RSOA in the set of RSOAs and channels light in proximity to an associated ring-resonator filter in a set of ring-resonator filters to cause optically coupled light to circulate in the associated ring-resonator filter (step 404). The system then optically couples light from a first subset of the set of ring-resonator filters that are associated with the first subset of RSOAs through a first shared optical waveguide that passes in proximity to the first subset of ring-resonator filters (step 406). The system also optically couples light from a second subset of the set of ring-resonator filters that are associated with the second subset of RSOAs through a second shared optical waveguide that passes in proximity to the second subset of ring-resonator filters (step 408).

Next, the system channels optical signals from the first shared optical waveguide into a first port of a symmetric power splitter, and channels optical signals from the second shared optical waveguide into a second port of the symmetric power splitter (step 410). Note that the symmetric power splitter comprises a reciprocal network having the first port, the second port, a third port and a fourth port, wherein light entering the first port is approximately equally split with a 90-degree phase difference between the third port and the fourth port, and wherein light entering the second port is approximately equally split with a 90-degree phase difference between the third port and the fourth port.

The system then channels light emanating from the third port through a third optical waveguide that passes in proximity to a shared ring resonator to cause optically coupled light to circulate in a first direction in the shared ring resonator (step 412). The system similarly channels light emanating from the fourth port through a fourth optical waveguide that passes in proximity to the shared ring resonator to cause optically coupled light to circulate in a second direction, which is opposite to the first direction, in the shared ring resonator (step 414).

Next, the system channels light that is optically coupled from the optical ring resonator and reflected back into the third and fourth optical waveguides through the symmetric power splitter (step 416). This causes reflected light which originated from a first RSOA through the first shared optical waveguide to be combined by the symmetric power splitter and directed back through the first shared optical waveguide to the first RSOA. Also, no reflected light which originated from the first RSOA is directed back through the second shared optical waveguide due to phase cancellation. In this way, the first RSOA, the first shared optical waveguide, the third and fourth optical waveguides, the symmetric power splitter and the optical ring resonator collectively form a first lasing cavity for the integrated laser. This also causes reflected light which originated from a second RSOA through the second shared optical waveguide to be combined by the symmetric power splitter and directed back through the second shared optical waveguide to the second RSOA. Also, no reflected light which originated from the second RSOA is directed back through the first shared optical waveguide due to phase cancellation. In this way, the second RSOA, the second shared optical waveguide, the third and fourth optical waveguides, the symmetric power splitter and the optical ring resonator collectively form a second lasing cavity for the integrated laser.

Finally, the system provides an output through an output optical waveguide, which is coupled to the shared ring resonator (step 418).

System

Figure 5:
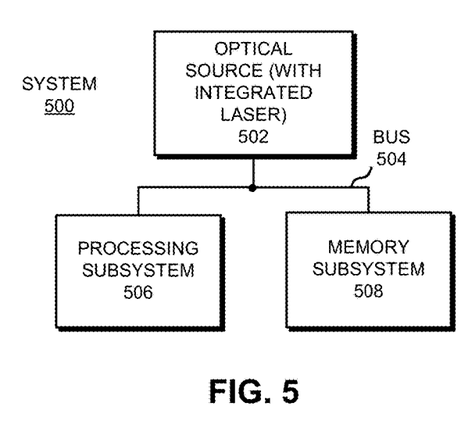
FIG. 5 illustrates a system that includes an optical source, such as an integrated laser, in accordance with an embodiment of the present disclosure.

One or more of the preceding embodiments of the integrated laser may be included in a system or device. More specifically, FIG. 5 illustrates a system 500 that includes an optical source 502 implemented using an integrated laser. System 500 also includes a processing subsystem 506 (with one or more processors) and a memory subsystem 508 (with memory).

In general, components within optical source 502 and system 500 may be implemented using a combination of hardware and/or software. Thus, system 500 may include one or more program modules or sets of instructions stored in a memory subsystem 508 (such as DRAM or another type of volatile or non-volatile computer-readable memory), which, during operation, may be executed by processing subsystem 506. Furthermore, instructions in the various modules in memory subsystem 508 may be implemented in: a high-level procedural language, an object-oriented programming language, and/or in an assembly or machine language. Note that the programming language may be compiled or interpreted, e.g., configurable or configured, to be executed by the processing subsystem.

Components in system 500 may be coupled by signal lines, links or buses, for example bus 504. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 500 may be at one location or may be distributed over multiple, geographically dispersed locations.

System 500 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 502 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An integrated laser, comprising:
   a set of reflective silicon optical amplifiers (RSOAs), including a first subset of RSOAs and a second subset of RSOAs;
   a set of ring-resonator filters, including a first subset of ring-resonator filters associated with the first subset of RSOAs and a second subset of ring-resonator filters associated with the second subset of RSOAs;
   a set of intermediate waveguides, wherein each intermediate waveguide is attached to an RSOA in the set of RSOAs, and channels light in proximity to an associated ring-resonator filter in the set of ring-resonator filters to cause optically coupled light to circulate in the associated ring-resonator filter;
   a shared ring resonator;
   a symmetric power splitter comprising a reciprocal network having a first port, a second port, a third port and a fourth port, wherein light entering the first port is approximately equally split with a 90-degree phase difference between the third port and the fourth port, and wherein light entering the second port is approximately equally split with a 90-degree phase difference between the third port and the fourth port;
   a first shared optical waveguide, which is coupled to the first port and passes in proximity to the first subset of ring-resonator filters so that the first subset of ring-resonator filters cause optically coupled light to flow in the first shared optical waveguide;
   a second shared optical waveguide, which is coupled to the second port and passes in proximity to the second subset of ring-resonator filters so that the second subset of ring-resonator filters cause optically coupled light to flow in the second shared optical waveguide;
   a third optical waveguide coupled to the third port, which channels light emanating from the third port in proximity to the shared ring resonator to cause optically coupled light to circulate in a first direction in the shared ring resonator;
   a fourth optical waveguide coupled to the fourth port, which channels light emanating from the fourth port in proximity to the shared ring resonator to cause optically coupled light to circulate in a second direction, which is opposite to the first direction, in the shared optical ring resonator; and
   an output optical waveguide, which is optically coupled to the shared ring resonator.

2. The integrated laser of claim 1, wherein each ring-resonator filter in the set of ring-resonator filters has a tunable frequency response.

3. The integrated laser of claim 2, wherein ring-resonator filters in the set of ring-resonator filters are tuned to lock onto different resonance frequencies of the shared ring resonator.

4. The integrated laser of claim 3, wherein the set of ring-resonator filters are tuned to lock onto a set of resonance frequencies for the shared ring resonator, wherein successive resonance frequencies in the set of resonance frequencies alternate between ring-resonator filters coupled to the first shared optical waveguide and ring-resonator filters coupled to the second shared optical waveguide, thereby reducing encroachment between the successive resonance frequencies on each of the first and second shared optical waveguides, which facilitates increasing the density of resonance frequencies that can be simultaneously utilized by the integrated laser.

5. The integrated laser of claim 1, wherein the integrated laser further comprises:
   a failure-detection mechanism that detects a failure of an RSOA in the set of RSOAs; and
   a switching mechanism that activates a spare RSOA when the failure-detection mechanism detects that the RSOA has failed, wherein the spare RSOA provides the same frequency as the failed RSOA.

6. The integrated laser of claim 1,
   wherein light emanating from a first RSOA in the first subset of RSOAs is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed back through the first shared optical waveguide back to the first RSOA, wherein no reflected light is directed back through the second shared optical waveguide due to phase cancellation, and wherein the first RSOA, the first shared optical waveguide, the third and fourth optical waveguides, the symmetric power splitter and the optical ring resonator collectively form a first lasing cavity for the integrated laser; and
   wherein light emanating from a second RSOA in the second subset of RSOAs is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed through the second shared optical waveguide back to the second RSOA, wherein no reflected light is directed back through the first shared optical waveguide due to phase cancellation, and wherein the second RSOA, the second shared optical waveguide, the third and fourth optical waveguides, the symmetric power splitter and the optical ring resonator collectively form a second lasing cavity for the integrated laser.

7. The integrated laser of claim 1, wherein the output optical waveguide has two ends that function as two outputs of the integrated laser.

8. The optical source of claim 7, further comprising a modulator coupled to each output of the integrated laser, wherein each output provides an optical carrier signal that is modulated by the associated modulator to communicate information.

9. The integrated laser of claim 1, wherein the set of RSOAs are located on one or more RSOA semiconductor chips, wherein the one or more RSOA semiconductor chips are separate from a semiconductor chip that includes the set of intermediate waveguides, the set of ring-resonator filters, the symmetric power splitter, the first and second shared optical waveguides, the third and fourth optical waveguides, the optical ring resonator and the output optical waveguide.

10. The integrated laser of claim 1, wherein the symmetric power splitter comprises one of:
a directional coupler; and
a multi-mode interferometer.

11. A system, comprising:
at least one processor;
at least one memory coupled to the at least one processor; and
an integrated laser for communicating optical signals generated by the system, wherein the integrated laser comprises:
a set of reflective silicon optical amplifiers (RSOAs), including a first subset of RSOAs and a second subset of RSOAs;
a set of ring-resonator filters, including a first subset of ring-resonator filters associated with the first subset of RSOAs and a second subset of ring-resonator filters associated with the second subset of RSOAs;
a set of intermediate waveguides, wherein each intermediate waveguide is attached to an RSOA in the set of RSOAs, and channels light in proximity to an associated ring-resonator filter in the set of ring-resonator filters to cause optically coupled light to circulate in the associated ring-resonator filter;
a shared ring resonator;
a symmetric power splitter comprising a reciprocal network having a first port, a second port, a third port and a fourth port, wherein light entering the first port is approximately equally split with a 90-degree phase difference between the third port and the fourth port, and wherein light entering the second port is approximately equally split with a 90-degree phase difference between the third port and the fourth port;
a first shared optical waveguide, which is coupled to the first port and passes in proximity to the first subset of ring-resonator filters so that the first subset of ring-resonator filters cause optically coupled light to flow in the first shared optical waveguide;
a second shared optical waveguide, which is coupled to the second port and passes in proximity to the second subset of ring-resonator filters so that the second subset of ring-resonator filters cause optically coupled light to flow in the second shared optical waveguide;
a third optical waveguide coupled to the third port, which channels light emanating from the third port in proximity to the shared ring resonator to cause optically coupled light to circulate in a first direction in the shared ring resonator;
a fourth optical waveguide coupled to the fourth port, which channels light emanating from the fourth port in proximity to the shared ring resonator to cause optically coupled light to circulate in a second direction, which is opposite to the first direction, in the shared optical ring resonator; and
an output optical waveguide, which is optically coupled to the shared ring resonator.

12. The system of claim 11, wherein each ring-resonator filter in the set of ring-resonator filters has a tunable frequency response.

13. The system of claim 12, wherein ring-resonator filters in the set of ring-resonator filters are tuned to lock onto different resonance frequencies of the shared ring resonator.

14. The system of claim 13, wherein the set of ring-resonator filters are tuned to lock onto a set of resonance frequencies for the shared ring resonator, wherein successive resonance frequencies in the set of resonance frequencies alternate between ring-resonator filters coupled to the first shared optical waveguide and ring-resonator filters coupled to the second shared optical waveguide, thereby reducing encroachment between the successive resonance frequencies on each of the first and second shared optical waveguides, which facilitates increasing the density of resonance frequencies that can be simultaneously utilized by the integrated laser.

15. The system of claim 11, wherein the integrated laser further comprises:
a failure-detection mechanism that detects a failure of an RSOA in the set of RSOAs; and
a switching mechanism that activates a spare RSOA when the failure-detection mechanism detects that the RSOA has failed, wherein the spare RSOA provides the same frequency as the failed RSOA.

16. The system of claim 11,
wherein light emanating from a first RSOA in the first subset of RSOAs is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed back through the first shared optical waveguide back to the first RSOA, wherein no reflected light is directed back through the second shared optical waveguide due to phase cancellation, and wherein the first RSOA, the first shared optical waveguide, the third and fourth optical waveguides, the symmetric power splitter and the optical ring resonator collectively form a first lasing cavity for the integrated laser; and
wherein light emanating from a second RSOA in the second subset of RSOAs is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed through the second shared optical waveguide back to the second RSOA, wherein no reflected light is directed back through the first shared optical waveguide due to phase cancellation, and wherein the second RSOA, the second shared optical waveguide, the third and fourth optical waveguides, the symmetric power splitter and the optical ring resonator collectively form a second lasing cavity for the integrated laser.

17. The system of claim 11, wherein the output optical waveguide has two ends that function as two outputs of the integrated laser.

18. The system of claim 11, wherein the set of RSOAs are located on one or more RSOA semiconductor chips, wherein the one or more RSOA semiconductor chips are separate from a semiconductor chip that includes the set of intermediate waveguides, the set of ring-resonator filters, the symmetric power splitter, the first and second shared optical waveguides, the third and fourth optical waveguides, the optical ring resonator and the output optical waveguide.

19. The system of claim 11, wherein the symmetric power splitter comprises one of:
   a directional coupler; and
   a multi-mode interferometer.

20. A method for generating optical signals, comprising:
   generating a set of optical signals by powering a set of reflective silicon optical amplifiers (RSOAs), including a first subset of RSOAs and a second subset of RSOAs;
   channeling the generated optical signals through a set of intermediate waveguides, wherein each intermediate waveguide is attached to an RSOA in the set of RSOAs and channels light in proximity to an associated ring-resonator filter in a set of ring-resonator filters to cause optically coupled light to circulate in the associated ring-resonator filter;
   optically coupling light from a first subset of the set of ring-resonator filters that are associated with the first subset of RSOAs through a first shared optical waveguide that passes in proximity to the first subset of ring-resonator filters;
   optically coupling light from a second subset of the set of ring-resonator filters that are associated with the second subset of RSOAs through a second shared optical waveguide that passes in proximity to the second subset of ring-resonator filters;
   channeling optical signals from the first shared optical waveguide into a first port of a symmetric power splitter, and channeling optical signals from the second shared optical waveguide into a second port of the symmetric power splitter, wherein the symmetric power splitter comprises a reciprocal network having the first port, the second port, a third port and a fourth port, wherein light entering the first port is approximately equally split with a 90-degree phase difference between the third port and the fourth port, and wherein light entering the second port is approximately equally split with a 90-degree phase difference between the third port and the fourth port;
   channeling light emanating from the third port through a third optical waveguide that passes in proximity to a shared ring resonator to cause optically coupled light to circulate in a first direction in the shared ring resonator;
   channeling light emanating from the fourth port through a fourth optical waveguide that passes in proximity to the shared ring resonator to cause optically coupled light to circulate in a second direction, which is opposite to the first direction, in the shared ring resonator;
   channeling light that is optically coupled from the optical ring resonator and reflected back into the third and fourth optical waveguides through the symmetric power splitter;
   wherein reflected light which originated from a first RSOA through the first shared optical waveguide is combined by the symmetric power splitter and directed back through the first shared optical waveguide to the first RSOA, wherein no reflected light which originated from the first RSOA is directed back through the second shared optical waveguide due to phase cancellation, and wherein the first RSOA, the first shared optical waveguide, the third and fourth optical waveguides, the symmetric power splitter and the optical ring resonator collectively form a first lasing cavity for the integrated laser;
   wherein reflected light which originated from a second RSOA through the second shared optical waveguide is combined by the symmetric power splitter and directed back through the second shared optical waveguide to the second RSOA, wherein no reflected light which originated from the second RSOA is directed back through the first shared optical waveguide due to phase cancellation, and wherein the second RSOA, the second shared optical waveguide, the third and fourth optical waveguides, the symmetric power splitter and the optical ring resonator collectively form a second lasing cavity for the integrated laser; and
   providing an output, which is optically coupled to one or more of the first lasing cavity and the second lasing cavity.

* * * * *

UNITED STATES PATENT AND TRADEMARK OFFICE
CERTIFICATE OF CORRECTION

PATENT NO. : 10,297,981 B2
APPLICATION NO. : 15/292792
DATED : May 21, 2019
INVENTOR(S) : Bovington et al.

It is certified that error appears in the above-identified patent and that said Letters Patent is hereby corrected as shown below:

In the Specification

In Column 5, Line 43, delete "$\lambda_2, \lambda_3, \lambda_5, \lambda_7$" and insert -- $\lambda_1, \lambda_2, \lambda_3, \lambda_4, \lambda_5, \lambda_6, \lambda_7$ --, therefor.

In the Claims

In Column 13, Line 1, in Claim 8, delete "optical source" and insert -- integrated laser --, therefor.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*